US005461302A

United States Patent [19]
Garcia et al.

[11] Patent Number: 5,461,302
[45] Date of Patent: Oct. 24, 1995

[54] MODULATED SNUBBER DRIVER FOR ACTIVE SNUBBER NETWORK

[75] Inventors: Richard R. Garcia; Pradhuman S. Zaveri, both of Plano, Tex.

[73] Assignee: AT&T Corp., Murray Hill, N.J.

[21] Appl. No.: 160,982

[22] Filed: Nov. 30, 1993

[51] Int. Cl.⁶ ............................................ G05F 1/613
[52] U.S. Cl. .............................. 323/222; 323/351
[58] Field of Search ............................ 323/222, 282, 323/299, 351; 361/18, 84

[56] References Cited

U.S. PATENT DOCUMENTS

| | | | |
|---|---|---|---|
| 5,252,907 | 10/1993 | Harris et al. | 323/351 X |
| 5,287,261 | 2/1994 | Ehsani | 323/222 X |
| 5,307,005 | 4/1994 | Ahladas et al. | 323/222 |

Primary Examiner—A. D. Pellinen
Assistant Examiner—Y. Jessica Han
Attorney, Agent, or Firm—Alfred G. Steinmetz

[57] ABSTRACT

A switching boost type voltage regulator includes a resonant snubber network connected in parallel with its FET power switch. The snubber includes a FET auxiliary switch that is connected and turned on in order to reduce the voltage across the FET power switch to a zero level at its turn-on transition. A driver circuit, driven by a voltage regulating pulse width modulation (PWM) pulse, initially turns on the FET auxiliary switch to reduce a voltage across the FET power switch and then turns on the FET power switch when the voltage across drops below a threshold level. The FET auxiliary switch is turned off when the FET power switch is turned on. A latch circuit insures the complimentary states of these two switches. The snubber circuit is disabled a near to zero voltage regardless of line and load levels and hence the power dissipation in the snubber is significantly reduced.

5 Claims, 1 Drawing Sheet

ACTIVE RESONANT VOLTAGE SNUBBER DRIVER

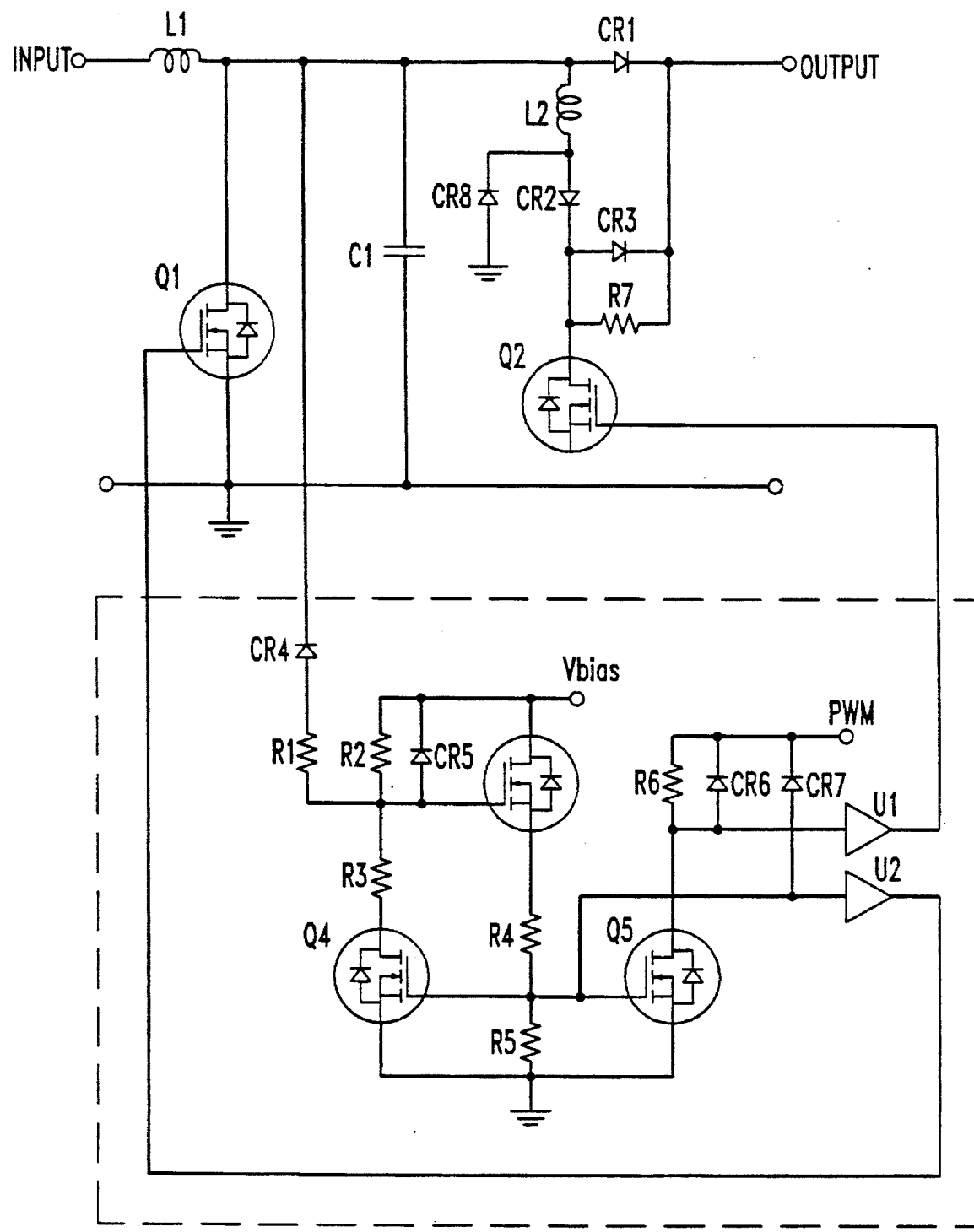
ACTIVE RESONANT VOLTAGE SNUBBER DRIVER

MODULATED SNUBBER DRIVER FOR ACTIVE SNUBBER NETWORK

FIELD OF THE INVENTION

This invention relates to power circuits and in particular to reducing voltages across the power switch during switching transitions.

BACKGROUND OF THE INVENTION

Modern requirements for power supplies generally specify operating efficiencies significantly above requirements acceptable in the past. This is due in part to the stringent environments in which modern power supplies must operate. These environments require higher power supply power densities and also limit the amount of dissipated heat that is allowable as compared with past requirements. Accordingly the individual components as well as the overall power supply must be operated in the most efficient manner possible.

A major source of power loss in switching type power supplies is to be found in the power dissipation occurring in individual components of the power supply. One such component, which is a major source of power dissipation, is the semiconductor power switch. Power dissipation is caused by the simultaneous occurrence of voltage across and current passing through the switch during its turn-off and turn-on transitions. During the turn-on transition, for example, the time interval of reduction of voltage across the switch is concurrent with a current flow through the switch and power dissipation occurs. This power dissipation is a direct function of the current level passing through the power switch. With the recent trend to higher output currents required of power supplies this has become a serious problem to the power supply designer.

One approach to reducing this turn-on transition dissipation has been the use of snubber circuits to control the voltage and current of the power switch during switching transitions. These snubber circuits have been used very successfully in high output power supplies of the past. The characteristic of the conventional snubber circuit involves a voltage reduction time interval that is dependent on the amplitude of current flowing through the snubber circuit. The design of the snubber circuit requires the selection of a reduction time interval that can handle worst case scenarios i.e. anticipated worst case conditions of line and load. In the instance of switching power supplies used for power factor enhancement in coupling an AC line to a circuit, the constantly changing instantaneous currents combined with the reduction time interval induces unnecessary conduction looses in the snubber circuit itself.

SUMMARY OF THE INVENTION

Therefore a snubber arrangement is provided for enhancing the efficiency of switching type power supplies by reducing turn-on transition induced losses in the circuit switching elements.

In a particular embodiment a switching boost type voltage regulator includes a resonant snubber network connected in parallel with its FET power switch. The snubber network includes a FET auxiliary switch that is connected to the FET power switch. This auxiliary switch is turned on, at a turn on transition, in order to reduce the voltage across the FET power switch to a zero level during its turn-on transition. A driver circuit, driven by a voltage regulating pulse width modulation (PWM) pulse, initially turns on the FET auxiliary switch to reduce a voltage across the FET power switch and then subsequently turns on the FET power switch when the voltage across it drops below a threshold level. The FET auxiliary switch is turned off after the FET power switch is turned on. A latch circuit insures the complimentary states of these two switches. The auxiliary switch is disabled at near zero voltage to limit power dissipation in the snubber itself.

BRIEF DESCRIPTION OF THE DRAWING

The sole figure is a circuit schematic of a switching power supply embodying the principles of the invention.

DETAILED DESCRIPTION

A boost type switching voltage regulator, as shown in the figure, accepts a DC voltage at its input and by biasing the FET power switch $Q_1$ conductive establishes a current in the energy storage inductor $L_1$. The voltage polarity of this inductor $L_1$ and the low drain-source voltage of the FET power switch $Q_1$ reverse biases the rectifying diode $CR_1$ during the conduction interval of the FET power switch $Q_1$. During the non-conducting interval of the power switch $Q_1$ the rectifying diode $CR_1$ becomes forward biased and the current due to energy stored in the inductor $L_1$ is conducted to the output.

In order to prevent significant power dissipation in the FET power switch $Q_1$, during a turn on transition, a snubber circuit is connected in parallel with the drain-source path of the FET power switch $Q_1$. This snubber circuit includes the inherent capacitance $C_1$ of the FET power switch $Q_1$ in parallel with the drain source path. A series circuit comprising the added components inductor $L_2$, diode $CR_2$, diode $CR_3$ and the FET auxiliary switch $Q_2$ also connected in parallel with the drain-source path of the power switch $Q_1$. In order to switch the FET power switch $Q_1$ with low or substantially zero voltage across it's drain-source path the FET auxiliary switch $Q_2$ is turned on first in each cycle of operation and is biased conducting before the turn-on transition of the FET power switch $Q_1$. The resonant action of the capacitor $C_1$ and inductor $L_2$ drives the drain voltage of the FET power switch $Q_1$ to a substantially zero level. When the zero voltage is attained the FET power switch $Q_2$ is biased conducting and almost immediately thereafter the FET auxiliary switch $Q_2$ is turned off. Energy stored in the inductor $L_2$ is discharged to the output via the diodes $CR_2$ and $CR_3$. The FET power switch $Q_1$ conducts for a duty cycle in each periodic cycle of operation appropriate for maintaining the voltage at the output at a regulated voltage level. This duty cycle is controlled by a pulse width modulated pulse generated by a feedback circuit which senses the output voltage and compares it to a reference voltage to generate an error voltage. The error voltage is used to control a pulse generator to generate pulse width modulated (PWM) pulses which are used to control the duty cycle. This feedback arrange new is well known in the art and it is not believed necessary to disclose such circuitry herein.

The PWM pulses are applied to the PWM input of a snubber driver circuit (shown enclosed by a dotted line in the FIG.) which generates and controls the sequence of the driver pulses for the FET power switch $Q_1$ and the FET auxiliary switch $Q_2$. It is connected by diode $CR_4$ to the drain terminal of the FET power switch $Q_1$. Diode $CR_4$ connects this drain terminal to the gate terminal of a FET device $Q_3$. The drain of FET device $Q_3$ is connected to a voltage $V_{bias}$. The snubber driver also includes the FET devices $Q_4$ and $Q_5$. Just prior to any initial turn on of the FET auxiliary switch $Q_2$ in the periodic cycle of operation, the PWM input is low, the diode $CR_4$ is reverse biased by the high voltage at the drain of the power switch $Q_1$, and the FET devices $Q_3$, $Q_4$ and $Q_5$ are all biased non-conducting. Two buffer circuits $U_1$ and $U_2$, connect the snubber driver to the gates of the FET power switch $Q_1$ and FET auxiliary switch $Q_2$, respectively.

Prior to the initiation of the PWM pulse the two buffers $U_1$ and $U_2$ are pulled low by the diodes $CR_6$ and $CR_7$. At the beginning of the PWM pulse, when the PWM voltage goes high, the voltage input to buffer $U_2$ is pulled up since the FET device $Q_5$ is non-conducting. With the buffer $U_1$ high and buffer $U_2$ low the FET auxiliary switch $Q_2$ is driven into a conducting state coincident with the leading edge of the PWM pulse while the FET power switch $Q_1$ remains non-conducting. With the FET device $Q_2$ conducting, the drain voltage of the FET power switch $Q_1$ and the cathode voltage of the diode $CR_4$ falls below the reference voltage $V_{bias}$. Diode $CR_4$ becomes forward biased causing the gate voltage of the FET device $Q_3$ to drop and bias it conducting. The gate voltage of the FET device $Q_4$ rises in response to the conduction of FET device $Q_3$ and FET device $Q_4$ turns on further regeneratively reducing the gate voltage of the FET device $Q_3$. This regenerative action causes the two FET devices $Q_3$ and $Q_4$ to latch into a conducting condition. The voltage divider comprising the resistors $R_1$ and $R_2$ set the turn-on threshold of the FET device $Q_3$. The gate voltage of the FET device $Q_4$ is determined by the voltage divider comprising resistors $R_4$ and $R_5$.

When the latch is triggered into the conducting state by the falling drain voltage of FET power switch $Q_1$, the gate of FET device $Q_5$ and the input to the buffer $U_2$ is driven high causing the output of buffer $U_2$ to go high and bias the FET power switch into a conducting state. The drain voltage of the FET device $Q_5$ goes low and the output of buffer $U_1$ goes low turning off the FET auxiliary switch $Q_2$.

The FET power switch $Q_1$ continues to conduct and remains conducting to the end of the PWM pulse which defines its duty cycle. When the PWM pulse voltage goes low the buffer $U_2$ and the drain of the FET device $Q_4$ is driven low through the diode $CR_7$ and the FET power switch $Q_1$ is turned off. The cathode voltage of the diode $CR_4$ rises above the voltage $V_{bias}$ and the snubber driver has cycled and is ready for the subsequent periodic cycle of operation.

The operation of the snubber circuit results in generation of currents in response to the reverse recovery of the diodes $CR_2$ and $CR_3$ which if ignored causes considerable power dissipation in the snubber circuit itself. The diode $CR_8$ and resistor $R_7$ have been added to counter act these reverse recovery characteristics. When the FET auxiliary switch $Q_2$ is turned off, the energy stored in the inductor $L_2$ induces a current flow which discharges through the diodes $CR_2$ and $CR_3$. This results in raising the anode voltage of the diode $CR_2$ and the drain voltage of the FET auxiliary switch $Q_2$ to a value substantially equal to the voltage at the output. As the current responsive to the energy of inductor $L_2$ decays to zero the anode voltage of the diode $CR_2$ drops to zero. This drop occurs while the FET power switch $Q_1$ is still conducting causing the voltage across the diode $CR_2$ to reverse causing a reverse recovery current flow to flow through the inductor $L_2$. This current continues to flow in the inductor $L_2$ even after the diode $CR_2$ has recovered, which causes a negative voltage at the anode of the diode $CR_2$. This voltage can be of sufficient magnitude to cause a break down of the diode $CR_2$. The addition of the diode $CR_8$ provides a shunt path for this reverse current of the inductor $L_2$ and clamps the reverse voltage level to a zero value.

While the diode $CR_2$ is recovering a current due to the discharge of the body capacitance of the FET auxiliary switch $Q_2$ discharges while the FET power switch is still conducting. When the FET power switch $Q_1$ is biased non conducting, its drain voltage rises and generates a reverse current that to flow through the inductor $L_2$ and charge the body capacitance of the FET auxiliary switch $Q_2$. This current continues to flow after the FET auxiliary switch $Q_2$ turns on and causes reverse recovery currents to flow through the diode $CR_3$ and the FET auxiliary switch $Q_2$ resulting in high losses and excessive noise in these components. The resistor $R_7$ connected in parallel with the diode $CR_3$ facilitates a recharging of the body capacitance of the FET auxiliary switch $Q_2$ to the output voltage level immediately following the reverse recovery of the diode $CR_2$ while the auxiliary switch is still off. With the body capacitance at the output voltage, no current is induced in the inductor $L_2$ and the reverse recovery of the diode $CR_3$ does not occur.

We claim:

1. In a switching type power supply;

an input and output;

a FET power switch periodically switched into a cyclic conduction state and connected for controlling energy transfer between the input and output;

an active resonant snubber network connected in parallel with the FET power switch and including in series connection of a FET auxiliary switch, an inductor and a clamp diode for limiting a voltage across the FET power switch at turn-on transitions;

a pulse width modulation (PWM) drive circuit for controlling states of the FET power switch and the FET auxiliary switch; including; a control voltage input for accepting a PWM control signal, circuitry for driving the FET auxiliary switch conducting when the PWM control signal goes high, a voltage detector responsive to a voltage of the FET power switch crossing a threshold voltage level; a latch circuit responsive to the voltage detector for simultaneously generating a first drive signal to turn off the FET auxiliary switch and a second drive signal to turn on the FET power switch, and operative to maintain an off condition for the FET auxiliary switch during remainder of the conduction state of the FET power switch; and circuitry for resetting the latch circuit when the PWM control signal goes low.

2. In a switching type power supply; as claimed in claim 1;

further including a resistor connected in parallel with the clamp diode.

3. In a switching type power supply; as claimed in claim 1;

further including a discharge diode connected to facilitate a current discharge from the inductor.

4. In a switching type power supply, as claimed in claim 1; wherein the latch circuit includes first and second FET devices, the gate terminal of the first FET device connected to the drain terminal of the second FET device and the gate terminal of the second FET device connected the source terminal of the first FET device and a source terminal of the second FET device connected to a source terminal of the first FET device, the drain terminal at the first FET device being connected to be energized by a bias voltage and the gate terminal of the first FET device coupled to a drain terminal of the power switch.

5. A boost switching voltage regulator, comprising an input to accept a DC voltage;

an energy storage inductor connected to accept energy from the input;

an FET power switch connected to complete a circuit path with the input and energy storage inductor when biased conducting allowing the energy storage inductor to store energy in response to current flow resulting from the applied DC voltage at the input; the FET power switch including an inherent capacitance shunting its drain-source path;

an output for supplying output energy to a load;

a rectifier diode for connecting the energy storage inductor to the output and arranged to be biased conducting when the FET power switch is non conducting;

an active resonant snubber circuit connected in parallel with the drain-source path of the FET power switch, and including; a series connection of a FET auxiliary switch, and inductor and a damp diode for limiting a voltage across the drain-source path of the FET power switch at turn-on transitions of the FET power switch, a resistor connected in parallel with the clamp diode and a discharge diode connected to facilitate a current discharge from the inductor;

a pulse width modulation (PWM) drive circuit for controlling states of the FET power switch and the FET auxiliary switch by driving the FET auxiliary switch conducting before and during a turn-on of the FET power switch and turn off the FET auxiliary switch after turn-on of the FET power switch and to maintain an off condition for the FET auxiliary switch during remainder of the conduction state of the FET power switch; including an input for accepting a PWM control signal, a first buffer circuit connected to be responsive to the PWM signal and apply a drive signal to the FET auxiliary switch, a second buffer circuit connected to be responsive to the PWM signal and apply a drive signal to the FET power switch, a latch circuit connected to sense a drain voltage of the FET power switch and operative to delay application of a drive signal to the FET power switch to delay turn on relative to the FET auxiliary switch, and the latch circuit having first and second FET devices with the gate terminal of the first FET device connected to the drain terminal of the second FET device and the gate terminal of the second FET device connected to the source terminal of the first FET device and a drain terminal of the first FET device energized by a bias voltage and a source terminal of the second FET device connected to a source terminal of the first FET device, the gate terminal of the first FET device coupled to a drain terminal of the power switch.

* * * * *